United States Patent
Saloio

(10) Patent No.: US 8,872,522 B2
(45) Date of Patent: Oct. 28, 2014

(54) FREQUENCY BASED FAULT DETECTION

(75) Inventor: James Saloio, Ludlow, MA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 757 days.

(21) Appl. No.: 13/016,207

(22) Filed: Jan. 28, 2011

(65) Prior Publication Data

US 2012/0194201 A1    Aug. 2, 2012

(51) Int. Cl.
G01R 31/08    (2006.01)
G01R 27/08    (2006.01)
G01R 27/26    (2006.01)
H02H 1/00    (2006.01)
H02H 9/04    (2006.01)
G01R 31/02    (2006.01)

(52) U.S. Cl.
CPC .............. *G01R 27/26* (2013.01); *H02H 1/003* (2013.01); *H02H 9/042* (2013.01); *G01R 31/02* (2013.01)
USPC ............................ 324/537; 324/522; 324/700

(58) Field of Classification Search
CPC ........ G01R 27/26; G01R 31/02; H02H 1/003; H02H 9/042
USPC ............... 324/522, 537, 538, 700, 713, 750.3
See application file for complete search history.

(56) References Cited

U.S. PATENT DOCUMENTS 3,995,200 A * 11/1976 Stolarczyk ..................... 361/48
4,389,694 A *  6/1983 Cornwell, Jr. ................. 361/48
2003/0164695 A1 * 9/2003 Fasshauer et al. ......... 324/76.21

OTHER PUBLICATIONS

The partial European Search Report in related European Application No. 11193791 filed Dec. 15, 2011.

* cited by examiner

Primary Examiner — Melissa Koval
Assistant Examiner — Farhana Hoque
(74) Attorney, Agent, or Firm — Kinney & Lange, P.A.

(57) ABSTRACT

A electrical circuit includes an excitation voltage connected via a first circuit path to an output, a switching device having a control terminal and first and second controlled terminals connected to the first circuit path, and a controller that generates a control signal provided to the control terminal of the switching device to selectively supply the excitation voltage to the output. Faults in the electrical circuit are detected by monitoring the switching device voltage at one of the controlled terminals of the switching device.

8 Claims, 7 Drawing Sheets

US 8,872,522 B2

FREQUENCY BASED FAULT DETECTION

BACKGROUND

The present invention is directed to fault detection in electrical circuits for which resistive-inductive-capacitive (RLC) loads are selectively excited by a switching device.

Fault detection and protection is required in most electrical applications. For some fault conditions, such as overvoltage faults, the simplest method of detection is to monitor the voltage and compare the monitored voltage to a threshold value. If the monitored voltage exceeds the threshold value, then an overvoltage condition is detected and protective action, such as de-exciting the system, is taken. However, this type of overvoltage detection requires dedicated hardware (e.g., voltage sensors, comparators) to detect overvoltage conditions. The same is true for other types of fault detection. For each fault to be detected, dedicated hardware circuitry is required to detect the fault, which increases the cost of the system.

SUMMARY

In one aspect, the present invention provides fault protection to an electrical circuit that includes an excitation voltage connected via a first circuit path to an output, a switching device having a control terminal and first and second controlled terminals, and a controller. The first and second controlled terminals are connected to the first circuit path, wherein the excitation voltage is selectively connected to the output based on a control signal provided by the controller to the control terminal at a first frequency. A comparator is connected to monitor a switch voltage at the first controlled terminal and to generate a feedback signal based on a comparison of the monitored switch voltage to a threshold voltage. The controller monitors the frequency associated with the feedback signal and detects a fault condition based on a comparison of the first frequency to the second frequency.

In another aspect, the present invention provides an electrical circuit that monitors the health of a transient voltage suppression (TVS) device. The electrical circuit includes an excitation voltage connected via a first circuit path to an output, a switching device having a control terminal and first and second controlled terminals, and a controller. The first and second controlled terminals are connected to the first circuit path, wherein the excitation voltage is selectively connected to the output based on a control signal provided by the controller to the control terminal. A comparator is connected to monitor a switch voltage at the first controlled terminal and to generate a feedback signal based on a comparison of the monitored switch voltage to a threshold voltage. The TVS device is connected in shunt or parallel with the first circuit path. The controller determines the operability of the TVS device based on a measured duration between a first rising edge and a first falling edge of the feedback signal following a transient overvoltage condition.

In another aspect, the present invention provides an electrical circuit connected to supply power to an inductive-capacitive (L-C) load, and capable of monitoring the health of the L-C load. The electrical circuit includes an excitation voltage connected via a first circuit path to an L-C load, a switching device having a control terminal and first and second controlled terminals, and a controller. The first and second controlled terminals are connected to the first circuit path, wherein the excitation voltage is selectively connected to the L-C load based on a control signal provided by the controller to the control terminal. A comparator is connected to monitor a switch voltage at the first controlled terminal and to generate a feedback signal based on a comparison of the monitored switch voltage to a threshold voltage. The controller calculates a frequency associated with oscillations in the monitored feedback signal following the switching device being turned Off to detect fault conditions in the L-C load.

DETAILED DESCRIPTION

The present invention provides a system and method of detecting a plurality of fault conditions based on a single monitored feedback signal, rather than a plurality of feedback signals each independently analyzed for fault conditions. The invention is applicable in a variety of circuits and applications. A commonality in the circuits in which it finds use, is the use of a switching device connected to a first circuit path between an excitation voltage and an output for connection to a resistive-inductive-capacitive (RLC) load. The switching device includes a control terminal and first and second controlled terminals. A control signal is provided by a controller to the control terminal of the switching device to selectively turn the device On and Off, and thereby selectively supply voltage from the excitation voltage to the output, respectively. The switch voltage at one of the controlled terminals is monitored and used in feedback to detect a plurality of fault conditions. Traditionally, feedback from the monitored switch voltage is used to monitor the operability of the switch itself. However, the frequency response of the switching voltage is used by the present invention to detect other types of faults, depending on the circuit employed and the application.

Figure 1:
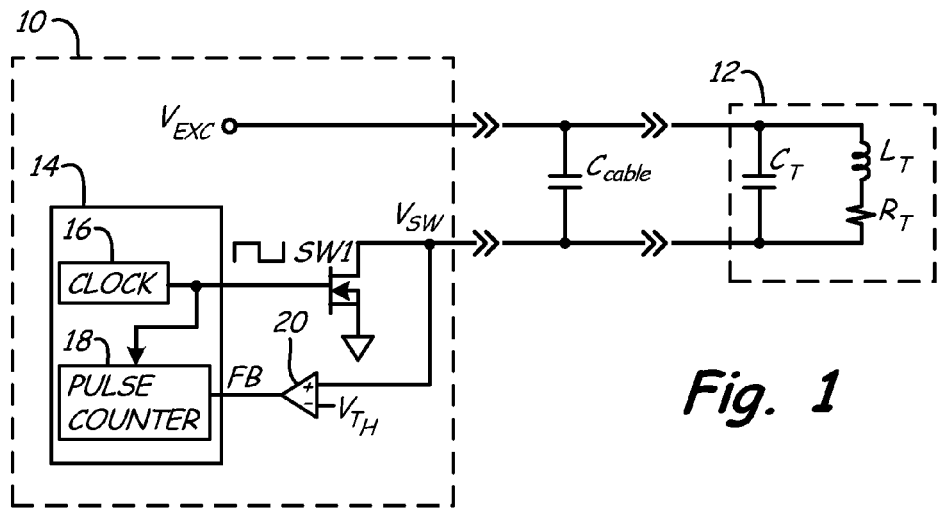
FIG. 1 is a circuit diagram of a driver circuit for an RLC circuit with fault detection according to an embodiment of the present invention.

FIG. 1 is a circuit diagram of driver circuit 10 for an RLC load circuit 12, the driver circuit 10 having frequency-based fault detection according to an embodiment of the present invention. Driver circuit 10 is connected to supply an alternating current (ac) voltage to RLC load circuit 12. Driver circuit 10 includes controller 14, which in turn includes clock 16 and pulse counter 18, direct current (dc) excitation voltage $V_{EXC}$, switching device SW1, and comparator 20. Switching device SW1 is a three-terminal device, including a control terminal and first and second controlled terminals. Excitation voltage is connected to RLC load circuit 12 by a first circuit path. The controlled terminals of switching device SW1 are connected to the first circuit path, with the state (e.g., On or Off) of switching device SW1 determining whether excitation voltage $V_{EXC}$ is supplied to RLC load circuit 12.

In the embodiment shown in FIG. 1, driver circuit 10 employs a low-side switch (i.e., switching device SW1 is connected on the low-side or return line of RLC load circuit 12), but other well-known driver configurations (e.g., high-side switch) may be employed. Also, in the embodiment shown in FIG. 1, controller 14 is a digital controller, and both clock 16 and pulse counter 18 (or frequency-to-digital converter) are digital devices. In other embodiments, however, controller 14 may be implemented with analog or discrete devices. Likewise, in the embodiment shown in FIG. 1, switching device SW1 is a metal-oxide semiconductor field-effect transistor (MOSFET) device, having a gate terminal (i.e., control terminal) and a drain and source terminals (i.e., controlled terminals), but in other embodiments switching device SW1 may be implemented with other well known devices capable of being selectively turned On and Off.

In the embodiment shown in FIG. 1, driver circuit 10 acts to supply an ac voltage to RLC load circuit 12 at a particular frequency. RLC load circuit 12 includes capacitance $C_T$ connected in parallel with inductance $L_T$ and resistance $R_T$. A number of applications employ load circuits that can be modeled by this combination of RLC circuit elements. For example, in aircraft applications, an oil-monitoring sensor is comprised of RLC components connected to receive an ac excitation voltage. A common type of fault in these circuits is an open-circuit fault in the capacitor. This type of fault results in excessive voltages being generated across RLC load circuit 12, which, if sufficiently high, may damage components within RLC load circuit 12 as well as within driver circuit 10. In addition, the excessive voltages may result in the generation of undesirable electromagnetic interference (EMI) that may disrupt the operation of components located nearby.

The present invention detects a fault in RLC load circuit 12, such as an open-circuit fault associated with capacitor $C_T$, by monitoring the frequency of the switching voltage $V_{SW}$ measured at one of the controlled terminals of switching device SW1. The frequency of switching voltage $V_{SW}$ is dependent on the resonance associated with RLC load circuit 12. During normal operations, the frequency of switching voltage $V_{SW}$ should be approximately the same as the clock frequency used to turn switching device SW1 On and Off. During a fault condition, such as an open-circuit fault in capacitor $C_T$ or capacitor $C_{cable}$, the magnitude of switching voltage $V_{SW}$ may increase and the frequency of the switching voltage $V_{SW}$ increases relative to the clock frequency. To detect the increase in frequency of switching voltage $V_{SW}$, the switching voltage $V_{SW}$ is monitored and compared to a threshold voltage $V_{TH}$ by comparator 20 to generate feedback signal FB. The feedback signal FB is high when monitored switch voltage $V_{SW}$ is greater than the threshold voltage $V_{TH}$, and low when the monitored switch voltage $V_{SW}$ is less than the threshold voltage $V_{TH}$.

Pulse counter 18 keeps a count associated with changes in the feedback voltage (e.g., rising edges, falling edges of feedback voltage FB), which are used to determine the frequency of the switching voltage $V_{SW}$. For example, pulse counter 18 monitors the clock signal generated by clock 16, and counts the number of falling edges associated with feedback signal FB during a single clock cycle. If the count is greater than a threshold value (e.g., greater than 1), this is indicative of a fault such as an open-circuit fault in capacitor $C_T$ or capacitor $C_{cable}$. In other embodiments, pulse counter 18 may be replaced with a frequency-to-digital converter that converts the monitored feedback signal to a digital value representing the frequency.

Figure 2A:
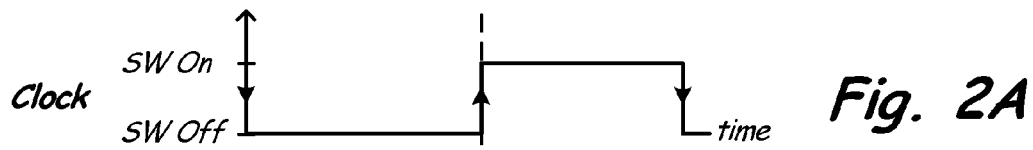
FIGS. 2A-2C are waveform diagrams representing normal operation of the driver circuit according to an embodiment of the present invention.
Figure 2B:
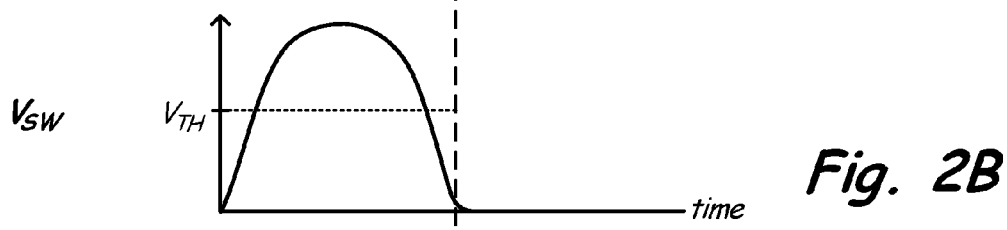
Figure 2C:
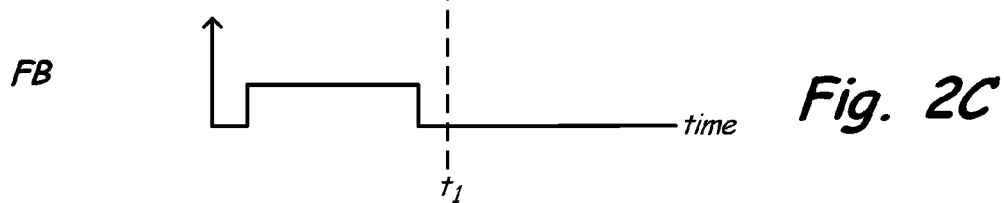

FIGS. 2A-2C are waveform diagrams representing normal operation of the driver circuit according to an embodiment of the present invention. In particular, FIG. 2A is a waveform representing the clock signal generated by clock 16, FIG. 2B is a waveform representing the monitored switch voltage $V_{SW}$, and FIG. 2C is a waveform representing the feedback signal FB generated by comparator 20 in response to the monitored switch voltage $V_{SW}$.

FIG. 2A illustrates a single clock cycle, wherein the switching device SW1 is Off during the low portion of the clock cycle, and On during the high portion of the clock cycle. During normal operation, the resulting switching voltage $V_{SW}$ (FIG. 2B) has a frequency approximately equal to the frequency of the clock. The frequency of the switching voltage $V_{SW}$ is detected by comparing the monitored switching voltage $V_{SW}$ to a threshold voltage $V_{Th}$ to generate the feedback signal FB (FIG. 2C). In this example, pulse counter 18 would generate a count of one (based on a count of either the number of rising edges or the number of falling edges of feedback signal FB) during a single clock cycle, indicating normal operation of load circuit 12.

Figure 3A:
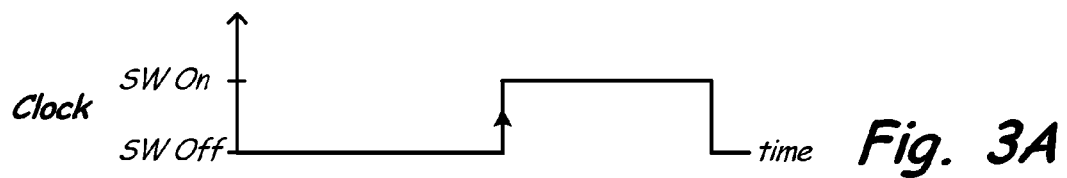
FIGS. 3A-3C are waveform diagrams representing detection of a fault condition in the driver circuit according to an embodiment of the present invention.
Figure 3B:
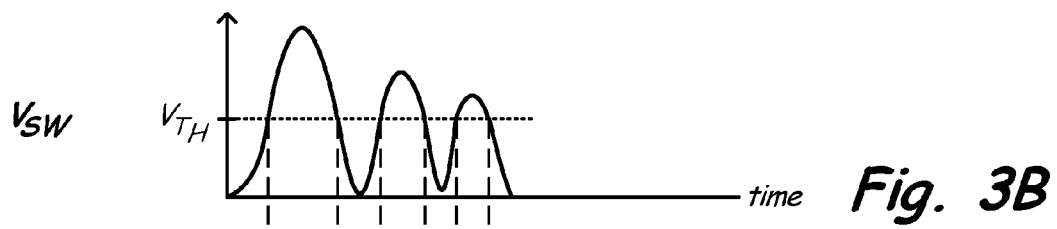
Figure 3C:
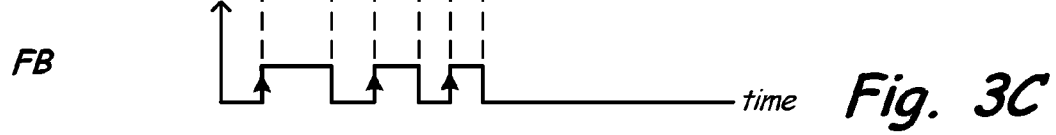

FIGS. 3A-3C are waveform diagrams representing detection of a fault condition in the driver circuit according to an embodiment of the present invention. FIG. 3A is a waveform representing the clock signal generated by clock 16, FIG. 3B is a waveform representing the monitored switch voltage $V_{SW}$, and FIG. 3C is a waveform representing the feedback signal FB generated by comparator 20 in response to the monitored switch voltage $V_{SW}$.

FIG. 3A illustrates a single clock cycle, wherein the switching device SW1 is Off during the low portion of the clock cycle, and On during the high portion of the clock cycle. During a fault condition such as an open circuit fault in capacitor $C_T$ or capacitor $C_{cable}$, the resulting switching voltage $V_{SW}$ has a frequency greater than the frequency of the clock. The frequency of the switching voltage $V_{SW}$ is detected by comparing the monitored switching voltage $V_{SW}$ to a threshold voltage $V_{Th}$ to generate the feedback signal FB. In this example, pulse counter 18 would generate a count of three (based on a count of either the number of rising edges or the number of falling edges of feedback signal FB) during a single clock cycle, indicating a fault condition in load circuit 12. In other embodiments, a dedicated frequency-to-digital converter is used to detect the frequency of the feedback signal FB (and therefore, the frequency of the switching voltage $V_{SW}$). In this embodiment, the calculated frequency of feedback signal FB can be compared by controller 14 to the frequency of the clock signal to detect faults.

Figure 4:
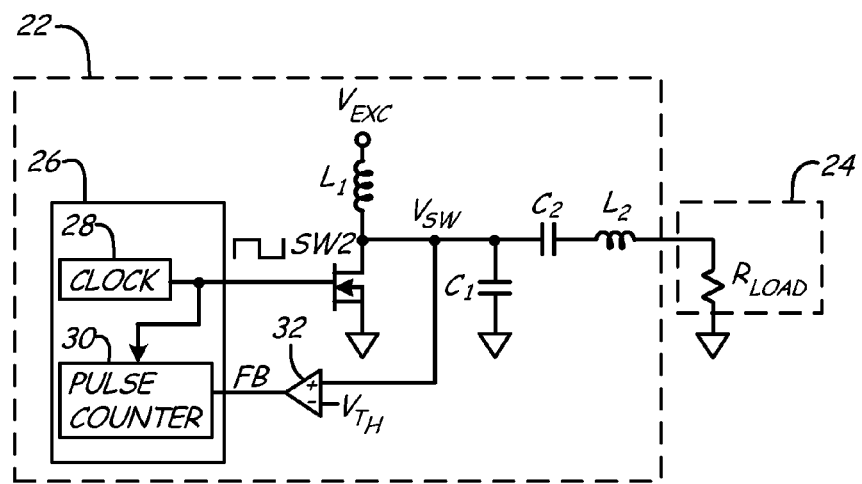
FIG. 4 is a circuit diagram of an amplifier circuit with fault detection according to an embodiment of the present invention.

FIG. 4 is a circuit diagram of another circuit, amplifier circuit 22, which employs the same method described with respect to FIG. 1 for detecting a fault condition according to an embodiment of the present invention. Amplifier circuit 22 includes many of the same circuit elements employed in the combination of driver circuit 10 and LC load circuit 12 shown in FIG. 1, and therefore provides a similar frequency response in response to a fault in the amplifier circuit.

In the embodiment shown in FIG. 4, amplifier circuit 22 is a typical class E-type amplifier that includes excitation voltage $V_{EXC}$ connected via a first circuit path to load 24. The first circuit path includes inductor L1 and capacitor C2, with switching device SW2 and capacitor C1 connected to the first circuit path to convert the dc voltage provided by excitation voltage $V_{EXC}$ to an ac voltage for supply to load 24. The switching device SW2 includes a control terminal and first and second controlled terminals. Clock 28 generates a clock signal that selectively turns switching device SW2 On and Off. In response to switching device SW2 being Off, the excitation voltage $V_{EXC}$ is supplied through inductor L1 to charge capacitor C1. When switching device SW2 is turned On, the voltage stored by capacitor C1 is discharged through capacitor C2 and inductor L2 to load 24, providing an ac signal to load 24.

During normal operations, the switch voltage $V_{SW}$ (measured at one of the controlled terminals) has a frequency that is approximately equal to the frequency of the clock signal. During a fault condition, such as an open-circuit fault in capacitor C1 or an improperly tuned amplifier, the switch voltage $V_{SW}$ has a frequency that is greater than the frequency of the clock signal. To detect the frequency of the switch voltage $V_{SW}$, the switching voltage $V_{SW}$ is monitored and compared to a threshold voltage $V_{TH}$ by comparator 32 to generate feedback signal FB. Pulse counter 30 keeps a count associated with changes in the feedback voltage (e.g., rising edges, falling edges of feedback voltage FB), which represents the frequency of the switching voltage $V_{SW}$. For example, pulse counter 30 monitors the clock signal generated by clock 28, and counts the number of falling edges associated with feedback signal FB during a single clock cycle. If the count is greater than a threshold value (e.g., greater than 1), this is indicative of a fault such as an open-circuit fault in capacitor C1. As discussed with respect to FIG. 1, pulse counter 30 may be replaced with a frequency-to-digital converter for generating a digital frequency value that is compared by controller 26 to the clock frequency to detect faults.

With respect to the embodiments shown in FIGS. 1 and 4, the frequency response of the switch voltage $V_{SW}$ is employed to detect fault conditions in the associated circuits. In many applications, the switch voltage is already monitored to ensure switching device SW is working properly. To detect the presence of a fault in other parts of the circuit, additional circuitry such as an overvoltage detection circuit would be required. In the embodiments described with respect to FIGS. 1 and 4, no additional overvoltage detection circuitry is required as the frequency of the switch voltage is used to detect fault conditions.

Figure 5:
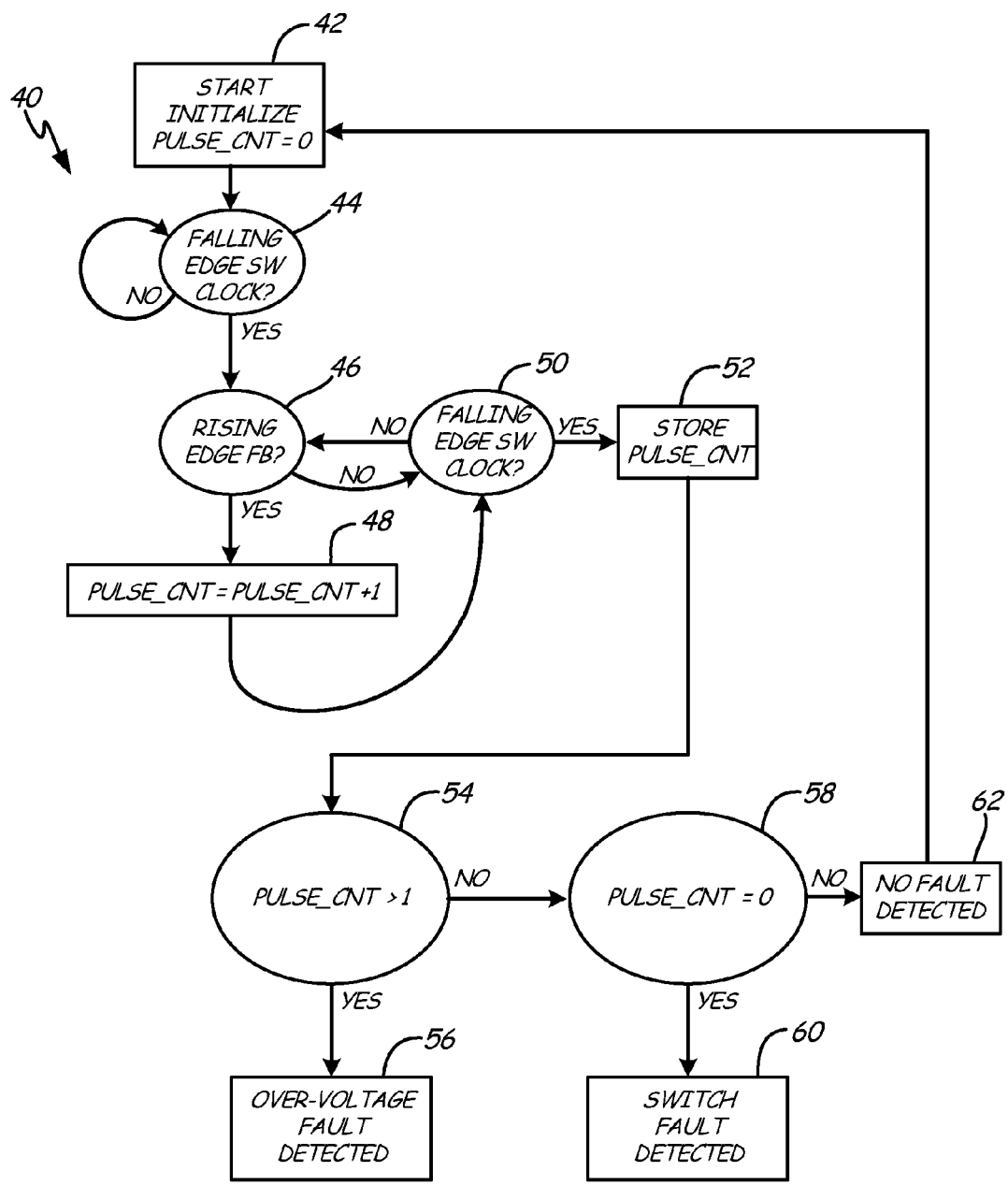
FIG. 5 is a flowchart illustrating steps performed to detect faults according to an embodiment of the present invention.

FIG. 5 is a flowchart illustrating method 40 performed by controller 14 (shown in FIG. 1) or controller 26 (shown in FIG. 4) to detect faults according to an embodiment of the present invention.

The method starts at step 42. The first step in the method is to detect the beginning of a clock cycle. At step 44, the clock signal is monitored for the presence of a falling edge (or rising edge, depending on the circuit configuration). At step 46, in response to a falling edge of the clock signal detected at step 44, the feedback signal FB is monitored for rising edges (or falling edges, depending on the circuit configuration). Each rising edge of the feedback signal FB results in the pulse count being incremented by one at step 48.

At step 50, while the feedback signal FB is monitored for rising edges, and the pulse count is incremented with respect to each rising edge detected, the clock signal is monitored for detection of a falling edge indicating the end of the clock cycle. Once a falling edge of the clock cycle is detected, indicating the end of the clock cycle, the current pulse count is stored at step 52. If no falling edge of the clock cycle has been detected, indicating the clock cycle is not over yet, then monitoring of the feedback signal continues at steps 46 and 48. Although numbering of the steps employed in method 40 does not denote the order in which the steps are performed. In particular, monitoring of the clock signal and the feedback signal may be performed concurrently or in parallel, and monitoring of the feedback signal would continue until a falling edge of the clock signal was detected.

At step 54, the frequency of the monitored feedback signal is compared to the frequency of the clock signal. In this embodiment, pulse counts of the feedback signal are maintained during a single cycle of the clock. Therefore, if the number of pulses is greater than one, this indicates that the frequency of the feedback signal is greater than the frequency of the clock. In this embodiment, at step 54, the stored pulse count is compared to a threshold value (e.g., 1) to determine whether a fault condition exists in the circuit (e.g., open-circuit fault in the capacitor $C_T$ described with respect to FIG. 1, or in the capacitor C1 described with respect to FIG. 4). If the stored pulse count is greater than 1, then at step 56 a fault condition is detected and corrective action is taken. In one embodiment, corrective action may include removing the source of excitation (e.g., excitation voltage $V_{EXC}$ from the circuit, or turning the switching device Off, either temporarily or permanently. If the stored pulse count is not greater than one, then at step 58, the stored pulse count is compared to a zero value. If the stored pulse count is equal to zero, then at step 60 a switch fault is detected (e.g., in switching device SW1 shown in FIG. 1, or switching device SW2 shown in FIG. 4). If the stored pulse count is not equal to zero, then at step 62 no fault is detected and monitoring continues at step 42.

Figure 6:
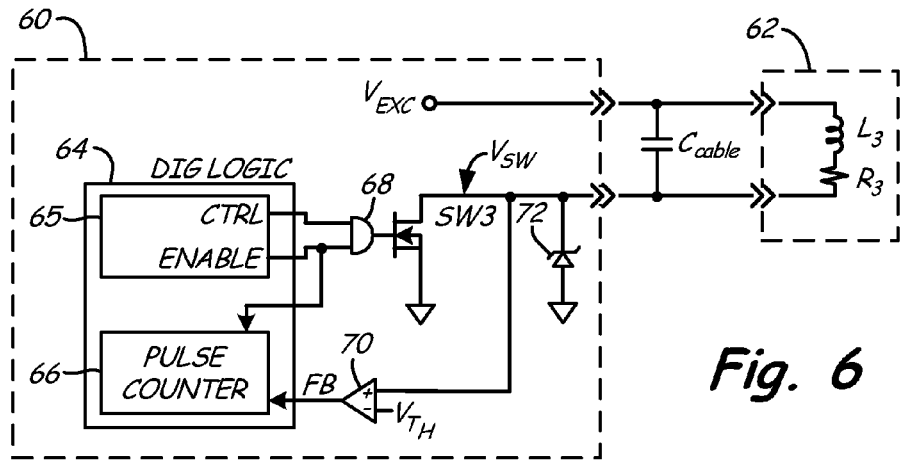
FIG. 6 is a circuit diagram of a driver circuit that includes an overvoltage protection circuit, wherein the driver circuit is configured to health/operability of the overvoltage protection circuit according to an embodiment of the present invention.

FIG. 6 is a circuit diagram of driver circuit 60 including an overvoltage protection circuit (transient voltage suppression device 72), the driver circuit 60 configured to monitor the operation of the overvoltage protection circuit according to an embodiment of the present invention.

In the embodiment shown in FIG. 6, driver circuit 60 is connected via a first circuit path to supply excitation to load 62 (illustrated here as including inductor L3 and resistor R3). Driver circuit 60 includes controller 64, which includes control logic 65 and pulse counter 66, logic gate 68, comparator 70, switching device SW3, and transient voltage suppression (TVS) device 72. Switching device SW3 includes a control terminal, and first and second controlled terminals, wherein the first and second controlled terminals are connected to the first circuit path. Controller 64 selectively controls the operation of switching device SW3 (i.e., turn switching device SW3 On and Off) to regulate the supply of power to load 62. In this embodiment, control logic 65 includes a control output CTLR and an enable output ENABLE that are used to selectively control the state of switching device SW3, although in other embodiments, a single control signal may be employed to regulate the operation of the switching device SW3.

In the embodiment shown in FIG. 6, driver circuit 60 further includes TVS device 72, connected to the first circuit path and in parallel with switching device SW3. TVS devices are commonly employed in aerospace application to protect electrical components, such as switching device SW3, from transient overvoltage conditions such as those generated as a result of lightning strikes. A TVS device may also be employed to protect switching device SW3 from the inductive-capacitive transient high voltage responses created when switching device SW3 is turned Off. In response to a transient overvoltage condition, TVS device 72 is activated or turned On, and acts to shunt the excess voltage, thereby protecting switching device SW3.

In the embodiment shown in FIG. 6, the operability of TVS device 72 is detected based on the frequency response of the switch voltage $V_{SW}$. During normal operations, in response to a transient voltage event, TVS device 72 is activated at a clamping voltage defined by the device to shunt the excess energy. The amount of time required to shunt the excess voltage is a function of the clamping voltage, the inductance associated with the circuit, and the inductor current. Assuming the inductance and inductance current remain approximately the same in the circuit, the duration of time required to shunt the excess energy is related to the clamping voltage.

During a fault condition in TVS device 72, a transient event does not result in the activation of TVS device 72 at the clamping voltage. Rather, the voltage is allowed to further increase to the breakdown voltage of switching device SW3. The breakdown voltage of the switching device SW3 is higher than the clamping voltage of TVS device 72. As a result, excess energy associated with the transient voltage is dissipated more quickly at the breakdown voltage. While switching device SW3 may be capable of dissipating large voltages a limited number of times, it is generally undesirable for transient voltage to be dissipated by switching device SW3. Faults in TVS device 72 are therefore determined by monitoring the switching device voltage $V_{SW}$ and monitoring the time required to dissipate the transient voltage. If the time required to dissipate the transient voltage is shorter than expected, this is indicative of a fault in TVS device 72. Normal operation is illustrated with respect to FIGS. 7A-7C, described in more detail below, while a fault condition is illustrated with respect to FIGS. 8A-8C, also described below.

In another embodiment, drive circuit 60 is capable of detecting shorted coil faults in load 62 based on the frequency response of the switching device voltage $V_{SW}$. During normal operations, after switching device SW3 is turned Off, inductor L3 associated with load circuit 62 causes the switching voltage to 'ring-out' or oscillate as a function of the inductance L3 and capacitance $C_{cable}$ associated with the output of driver circuit 60. If no ring-out or oscillation is detected following switching device SW3 being turned Off, this is indicative of a short-circuit fault in inductor L3 (commonly referred to as a shorted coil).

In another embodiment, drive circuit 60 is capable of monitoring the overall health of load circuit 62 by monitoring the frequency of ring-out or oscillations associated with switching voltage $V_{SW}$ after switch SW3 is turned Off. Based on the monitored frequency, the inductance of load 62 can be calculated. Changes in the inductance from expected values indicate potential faults in load 62. In one embodiment, following detection of a first falling edge of feedback signal FB after switching device SW3 has been turned off, an oscillation timer (for example, maintained by pulse counter 66) is started and a count is kept of the number of subsequent falling edges of feedback signal FB. These two values, the time kept by the oscillation timer and a count of the number of falling edges of feedback signal FB, are used to calculate the frequency of the oscillations. The calculated frequency is compared to an expected frequency indicating a healthy system, and deviations from the expected frequency indicate potential faults in load circuit 62.

Figure 7A:
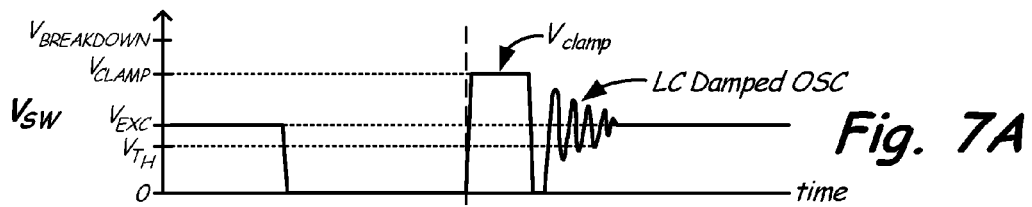
FIGS. 7A-7C are waveform diagrams representing normal operation of the overvoltage protection circuit according to an embodiment of the present invention.
Figure 7B:
Figure 7C:
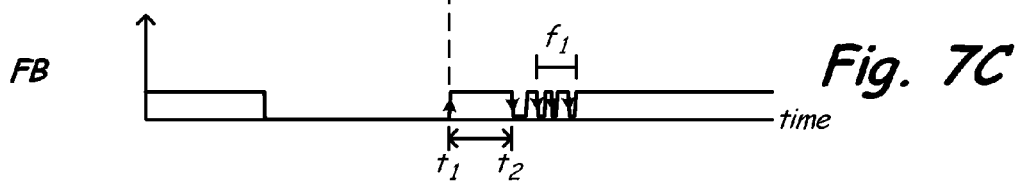

FIGS. 7A-7C are waveform diagrams representing normal operation of the overvoltage protection circuit according to an embodiment of the present invention. FIG. 7A illustrates the switching voltage as compared with various thresholds, including the breakdown voltage $V_{breakdown}$, the clamping voltage $V_{clamp}$, the excitation voltage $V_{EXC}$, and the threshold voltage $V_{TH}$. FIG. 7B illustrates the state of the enable signal, which turns switching device SW3 On when high and Off when low. FIG. 7C illustrates the resulting feedback signal FB generated by comparator circuit 70 in response to the monitored switching voltage $V_{SW}$ as compared to the threshold voltage $V_{TH}$.

At time t1, switching device SW3 is turned Off and a resulting transient voltage causes the switching voltage to increase to the clamping voltage $V_{clamp}$. At the clamping voltage, TVS device 72 is activated, thereby shunting the excess voltage through TVS device 72. The amount of time required to shunt the excess voltage is determined by monitoring the time between the first rising edge of feedback signal FB, t1, and the first falling edge of feedback signal FB, t2, after the switching device SW3 has been turned Off. If the measured time period is less than an expected time period, this is indicative of a fault in TVS device 72 that prevented the device from activating.

In addition, following detection of the first falling edge of feedback signal FB at time t2, subsequent monitoring of the oscillations of feedback signal FB allow the frequency f1 of the oscillations to be measured and used to determine the overall health of load circuit 62. In one embodiment, the frequency computation excludes the first falling edge of the feedback signal FB because the first pulse is typically distorted by the TVS device inhibiting the natural oscillation frequency of the LC load. The monitored frequency f1 varies with changes to the overall impedance (i.e., capacitance and inductance) at the output of driver circuit 60. Changes in the frequency are therefore indicative of potential faults such as faults in the inductive windings of a load or faults in the cables carrying power to load circuit 62. In one embodiment, the monitored frequency f1 is compared to an expected frequency associated with a healthy system. Differences between the monitored frequency f1 and expected frequency are used to detect fault conditions.

Figure 8A:
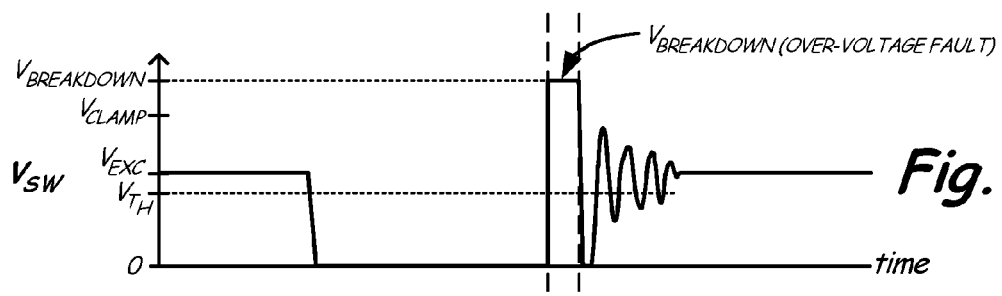
FIGS. 8A-8C are waveform diagrams representing faulty operation of the overvoltage protection circuit according to an embodiment of the present invention.
Figure 8B:
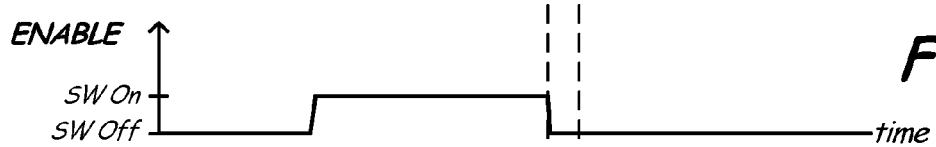
Figure 8C:
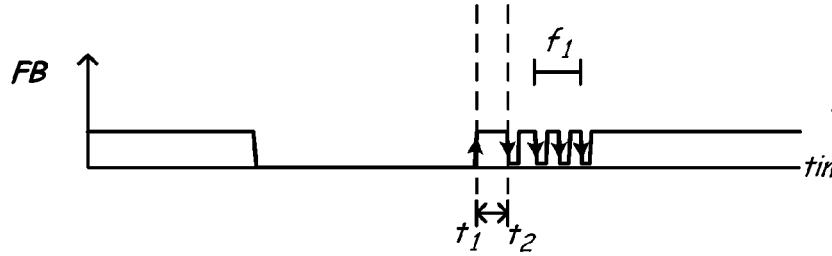

FIGS. 8A-8C are waveform diagrams representing faulty operation of the overvoltage protection circuit according to an embodiment of the present invention. Once again, FIG. 8A illustrates the switching voltage as compared with various thresholds, including the breakdown voltage $V_{breakdown}$, the clamping voltage $V_{clamp}$, the excitation voltage $V_{EXC}$, and the threshold voltage $V_{TH}$. FIG. 8B illustrates the state of the enable signal, which turns switching device SW3 On when high and Off when low. FIG. 8C illustrates the resulting feedback signal generated by comparator circuit 70 in response to the monitored switching voltage $V_{SW}$ as compared to the threshold voltage $V_{TH}$.

At time t1, switching device SW3 is turned Off and a resulting transient voltage causes the switching voltage to increase. However, in contrast with the example described with respect to FIG. 7A, in this example the transient voltage rises to the breakdown voltage $V_{breakdown}$ of switching device SW3. Because the breakdown voltage $V_{breakdown}$ is greater than the clamping voltage $V_{clamp}$, the excess energy associated with the transient voltage is shunted more quickly. As a result, the amount of time between the rising (time t1) and falling edges (time t2) of feedback signal FB after the switching device SW3 has been turned Off is less than the time between the rising and falling edges of the feedback signal FB monitored during normal operation (shown in FIG. 7C). On a given circuit with equivalent initial conditions, the normal operating t2-t1 time is approximately reduced by the ratio of Vclamp to Vbreakdown (i.e. Vclamp/Vbreakdown) when the TVS device is faulty. Because the monitored time period between the rising and falling edges is less than an expected time period, this is indicative of a fault in TVS device 72.

Figures 9A, 9B, 9C:
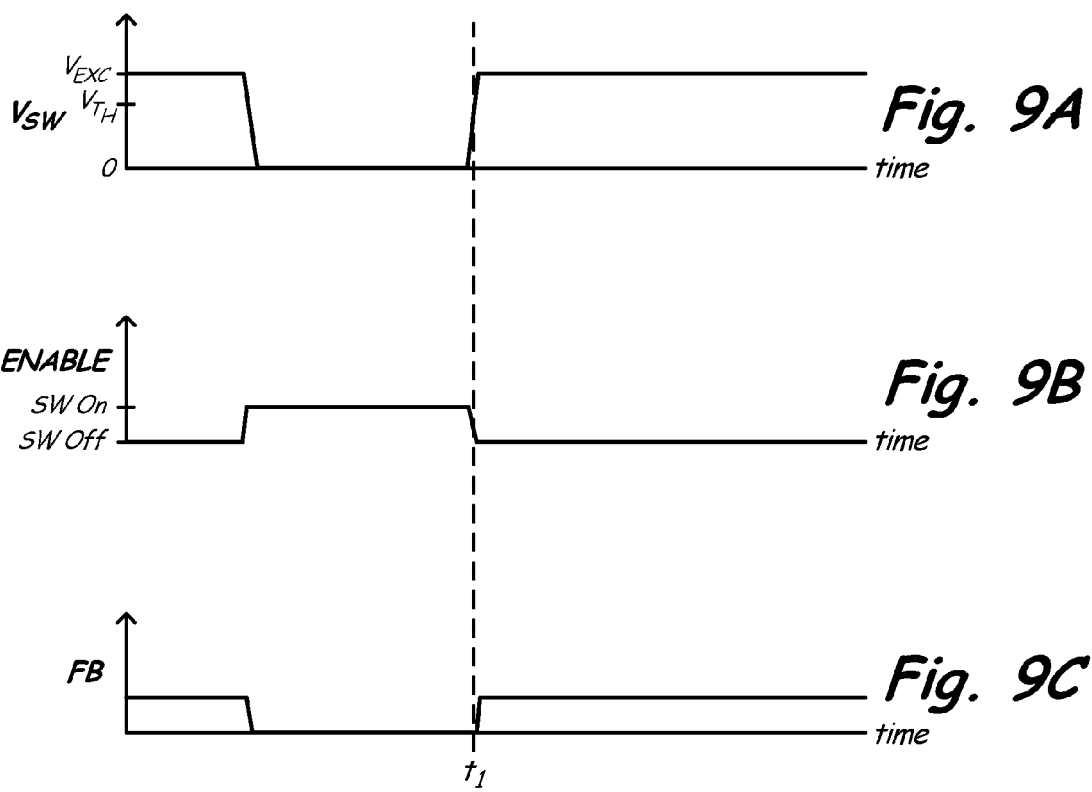
FIGS. 9A-9C are waveform diagrams representing detection of a fault in the inductive load driven by the driver circuit according to an embodiment of the present invention.

FIGS. 9A-9C are waveform diagrams representing detection of fault in the inductive load driven by the driver circuit according to an embodiment of the present invention. Once again, FIG. 9A illustrates the switching voltage as compared with the threshold voltage $V_{TH}$. FIG. 9B illustrates the state of the enable signal, which turns switching device SW3 On when high and Off when low. FIG. 9C illustrates the resulting feedback signal generated by comparator circuit 70 in response to the monitored switching voltage $V_{SW}$ as compared to the threshold voltage $V_{TH}$.

In addition to verifying the operation of TVS device 72, the frequency response of switching voltage $V_{SW}$ may in addition be used to detect the presence of a shorted coil (i.e., a short across inductor L3). During normal operation, the combination of inductance within load 62 and capacitance $C_{cable}$ associated with the cables connecting driver circuit 60 to load 62, an LC circuit is created that results in a characteristic ring-out each time switching device SW3 is turned Off. If this characteristic ring-out is not detected, this is indicative of a short-circuit condition windings (i.e., inductance) of load 62.

At time t1, switching device SW is turned Off. In contrast to the expected ring-out (shown for example, in FIGS. 7A and 8A following turn-off of switching device SW3), the monitored switching device voltage $V_{SW}$ remains constant at the excitation voltage threshold. The lack of ring-out in the monitored switching device voltage $V_{SW}$ is reflected in the feedback signal FB, which remains constant after time t1.

Figure 10:
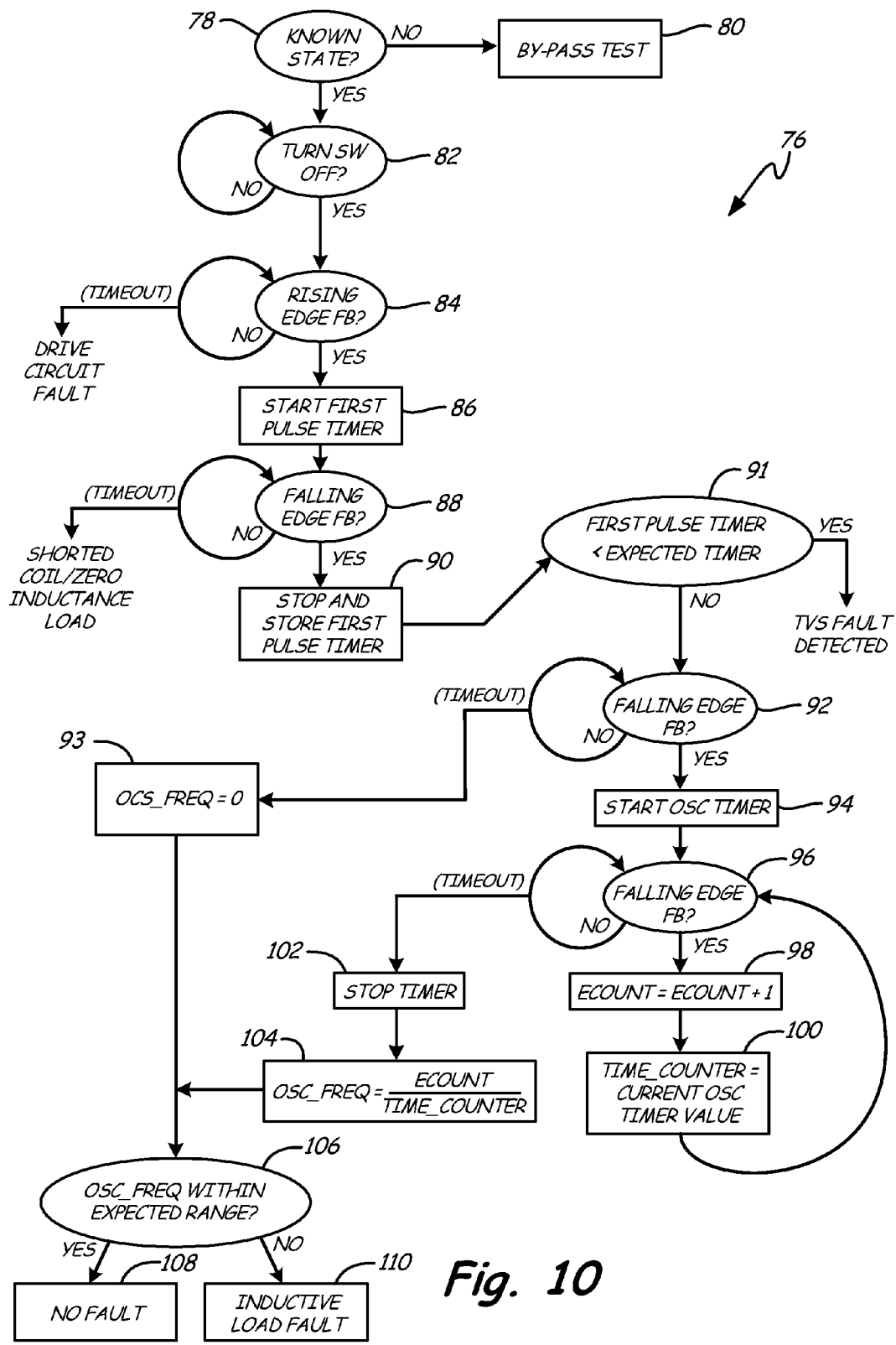
FIG. 10 is a flowchart illustrating steps performed to detect faults in the operation of the overvoltage protection circuit and the inductive load according to an embodiment of the present invention.

FIG. 10 is a flowchart illustrating steps performed by digital logic 64 to detect faults in the operation of the overvoltage protection circuit and the inductive load according to an embodiment of the present invention. Steps 78-91 are related to monitoring the health or operability of TVS device 72, while steps 92-110 are related to monitoring the health/status of the inductive load (i.e., load 62).

At step 78, the load current is monitored to assure that the circuit is in a known state. That is, the required settling time for the circuitry must be allowed such that the load current has reached a steady-state from the time when the controller enabled the excitation. If a known state cannot be acquired, then at step 80 the test is by-passed. Otherwise, at step 82, switching device SW3 is monitored to detect whether the device has been turned Off. In the embodiment shown in FIG. 6, this determination is made by monitoring the ENABLE signal provided to the input of switching device SW3.

At step 84, in response to detection that switching device SW3 has been turned Off, the feedback signal FB is monitored to detect a rising edge (or a falling edge, depending on the circuit configuration). If no rising edge is detected after a defined time period (e.g., timeout), this is indicative of a fault in the drive circuit (e.g., a failed closed fault in switching device SW3).

At step 86, in response to a detected rising edge of feedback signal FB, a first pulse timer is started. In the embodiment shown in FIG. 6, pulse counter 66 may include a timer circuit for performing this operation. The timer continues until a falling edge of feedback signal FB is detected (or a rising edge, depending on the circuit configuration).

At step 88, feedback signal FB is monitored for a falling edge (or rising edge, depending on the circuit configuration). If no falling edge is detected, typically after a time-out period, this is indicative of a short-circuit fault associated with the inductive load in load circuit 62 (e.g., a shorted coil or a zero-inductance load).

At step 90, following detection of a falling edge of feedback signal FB, the first pulse timer is stopped and the value of the timer is stored. At step 91, the stored timer value is compared to an expected timer value to determine the health of TVS device 72. If the stored timer value is less than the expected timer value, this is indicative of TVS device failing to activate at the clamping voltage, and transient voltages instead being dissipated across switching device SW3 at the breakdown voltage of the device. Otherwise, if the stored timer value is not less than the expected timer value, this indicates that TVS device 72 is functioning properly. In this way, the health of TVS device 72 may be assessed based on the monitored switching voltage $V_{SW}$.

Steps 78-91 describe monitoring of the feedback signal to detect faults such as failures in the drive circuit, short-circuits across the inductive load, and health monitoring of the TVS device used to protect circuit components from transient voltages.

Steps 92-110 describe additional monitoring of the feedback signal, which may be performed alone or in conjunction with monitoring performed at steps 78-91, to monitor the health of the inductive load. In these steps, the frequency of oscillations associated with feedback signal FB are monitored and compared to an expected value to detect changes in inductive load indicative of fault conditions.

At step 92, a falling edge of feedback signal FB is detected (or rising edge, depending on the circuit configuration). The falling edge of interest in this step is the second falling edge following turn off of switching device SW. The time between the first falling edge and first rising edge are used to determine the health of TVS device 72. If no falling edge of feedback signal FB is detected at step 92 within a defined time period (e.g., timeout), then at step 93 the oscillation frequency is determined to be zero.

At step 94, in response to a detected falling edge of feedback signal FB, an oscillation timer (e.g., maintained by pulse counter 66) is started. The frequency of the oscillations is measured by dividing the number of pulses detected by the time stored by the oscillation timer.

At step 96, a falling edge of feedback signal is detected, and for each detected falling edge, a counter ECOUNT is incremented by one at step 98 and the current time maintained by the oscillation timer is stored at step 100. This process continues until no more falling edges of feedback signal FB are detected (e.g., a timeout occurs with respect to step 96).

In response to timeout at step 96, the oscillation timer is stopped at step 102. At step 104, the count value ECOUNT stored at step 98 and the current oscillation timer value stored at step 100 are used to calculate the oscillation frequency of the oscillations. The frequency is related to the number of oscillations detected (e.g., the number of detected falling edges) divided by the timer value stored by the oscillation timer. At step 106, the oscillation frequency is compared to an expected oscillation frequency. If the measured oscillation frequency is within the expected range, then at step 108 indication is provided that no fault has been detected. If the measured oscillation frequency is different than the expected oscillation frequency, this is indicative of a change of inductance in load circuit 62. At step 110, if the difference in the frequencies is significant (e.g., greater than some threshold value), this is indicative of a fault condition or possible change/degradation in the load circuit.

In general, the fault detection logic should employ persistence checks (e.g. three faults in a row) prior to setting a fault in order to avoid nuisance fault indication. Responses to detected fault conditions may vary based on the application and the fault detected. In some cases, a detected fault requires the system to be shut down, either by removing power from the system, turning Off the switching device, or activating a relay to disconnect the circuit from the larger system. In other embodiments, detection of a fault condition may be noted and reported for subsequent inspection by maintenance.

In this way, the present invention provides the capability to detect a plurality of fault conditions based on the monitored switching voltage, and in particular, to the frequency response of the monitored switching voltage. Depending on the type of circuit and the application, the present invention can be used to detect a plurality of faults based on the monitored response of the switching device voltage. For example, in a driver circuit for an LC load circuit, the frequency response of the switching device voltage is used to detect open-circuit capacitor faults that can cause overvoltage conditions. In an amplifier circuit, the frequency response of the switching device voltage is used to detect open-circuit capacitor faults within the amplifier itself. In driver circuits for inductive loads (e.g. solenoid, relay, motor) protected by transient overvoltage protection devices, the health of the TVS device can be determined by the measured time response of the switching voltage following a transient voltage event. Similarly, in a drive circuit for an inductive load (e.g., solenoid, relay, motor), the health of the inductive load can be monitored by monitoring the frequency response of the ring-out or oscillations following the turn-off of the switching device, and the lack of any ring-out or oscillations can be used to detect the presence of a short-circuit fault or change/degradation in the inductive-capacitive load.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electrical circuit with fault detection, the electrical circuit comprising:
   an excitation voltage connected via a first circuit path to an output;
   a switching device having a control terminal and first and second controlled terminals, the controlled terminals connected in the first circuit path, wherein a control signal provided to the control terminal selectively controls supply of the excitation voltage to the output;
   a controller for providing the control signal to the control terminal of the switching device at a first frequency;
   a comparator connected to monitor a switch voltage at the first controlled terminal of the switching device and generate a feedback signal based on a comparison of the monitored switch voltage to a threshold voltage;
   wherein the controller monitors a second frequency associated with the feedback signal and detects a fault condition based on a comparison of the first frequency to the second frequency; and
   wherein the electrical circuit is an amplifier circuit having at least one inductive component and at least one capacitive component, wherein a capacitive open-circuit fault condition is detected when the monitored second frequency is greater than the first frequency.

2. The electrical circuit of claim 1, wherein the controller compares the first frequency to the second frequency by counting a number of rising edges of the feedback signal within a single cycle of the control signal and detects a fault condition if the number of rising edges is greater than a threshold value.

3. The electrical circuit of claim 2, wherein the controller includes a pulse counter that is incremented with each rising edge of the feedback signal, wherein a pulse counter value is stored when an end of the single cycle of the control signal is detected.

4. The electrical circuit of claim 2, wherein the controller includes a pulse counter that is incremented with each falling edge of the feedback signal, wherein a pulse counter value is stored when an end of the single cycle of the control signal is detected.

5. The electrical circuit of claim 1, wherein the electrical circuit is a driver circuit for an inductive-capacitive (LC) circuit, wherein a capacitive open-circuit fault condition is detected when the monitored second frequency is greater than the first frequency.

6. A method of detecting open-circuit capacitance faults in an amplifier circuit that includes at least one inductive component, at least one capacitive component, an excitation voltage connected to an output via a first conductive path and at least one switching device, having a control terminal and first and second controlled terminals connected in the first conductive path, and a controller connected to provide a control signal to the control terminal of the switching device to selectively control supply of the excitation voltage to the output, the method comprising:
   monitoring a switching device voltage at the first controlled terminal of the switching device;
   comparing the switching device voltage to a threshold voltage to generate a feedback signal that indicates whether the switching device voltage is greater than or less than the threshold voltage;
   monitoring a frequency response of the feedback signal and comparing the frequency response of the feedback signal to the frequency of the control signal provided to the switching device; and
   detecting an open-circuit capacitive fault when the monitored frequency of the feedback signal is greater than the frequency of the control signal.

7. The method of claim 6, wherein monitoring the frequency response of the feedback signal includes maintaining a count of a number of cycles detected in the feedback signal within a single cycle of the control signal.

8. The method of claim 7, wherein detecting an open-circuit capacitive fault includes comparing the count of the number of cycles detected in the feedback signal to a threshold value and indicating a fault condition if the count is higher than the threshold value.

* * * * *